(12) United States Patent
Oita et al.

(10) Patent No.: US 7,378,916 B2
(45) Date of Patent: May 27, 2008

(54) CRYSTAL OSCILLATOR DEVICE, OSCILLATION METHOD AND HEATER

(75) Inventors: Takeo Oita, Sayama (JP); Minoru Fukuda, Sayama (JP); Takaaki Ishikawa, Sayama (JP); Akihiro Nakamura, Sayama (JP); Kozo Ono, Sayama (JP); Fumio Asamura, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 15 days.

(21) Appl. No.: 11/057,453

(22) Filed: Feb. 14, 2005

(65) Prior Publication Data

US 2005/0184819 A1    Aug. 25, 2005

(30) Foreign Application Priority Data

Feb. 20, 2004  (JP) .............................. 2004-045230

(51) Int. Cl.
*H03B 5/32* (2006.01)

(52) U.S. Cl. ...................... 331/158; 331/60; 331/162; 310/361

(58) Field of Classification Search ................ 331/158, 331/162, 60; 310/361
See application file for complete search history.

(56) References Cited

U.S. PATENT DOCUMENTS

| | | | | |
|---|---|---|---|---|
| 3,624,355 | A | * 11/1971 | Friedrichs | .................... 219/497 |
| 4,079,280 | A | 3/1978 | Kusters et al. | |
| 4,160,183 | A | * 7/1979 | Kusters et al. | .............. 310/315 |
| 4,215,308 | A | 7/1980 | Kusters | |
| 4,419,600 | A | 12/1983 | Sinha | |
| 4,525,647 | A | 6/1985 | Dworsky | |
| 4,748,367 | A | 5/1988 | Bloch et al. | |
| 4,859,969 | A | * 8/1989 | Malinowski et al. | .......... 331/43 |
| 4,868,488 | A | * 9/1989 | Schmall | ...................... 324/635 |

(Continued)

FOREIGN PATENT DOCUMENTS

JP          54-066053          5/1979

(Continued)

OTHER PUBLICATIONS

R. Karlquist et al.; "A Low-Profile High-Performance Crystal Oscillator for Timekeeping Applications"; Proceeding of the IEE Int'l. Frequency Control Symposium; pp. 1-12, 28-30; May 1997.

(Continued)

*Primary Examiner*—Benny Lee
*Assistant Examiner*—Levi Gannon
(74) *Attorney, Agent, or Firm*—Greer, Burns & Crain, Ltd.

(57) ABSTRACT

The crystal oscillator device for simultaneously generating oscillator signals with a plurality of oscillation modes of a crystal unit, comprising: a primary resonator unit filtering the oscillator signal with a primary oscillation mode, which is one of the oscillation modes, from the output of the crystal unit, a secondary resonator unit filtering the oscillation signal, bearing a different resonance frequency from that of the primary resonator unit, with the primary oscillation mode from the output of the crystal unit, a primary phase synthesis unit, synthesizing the phases of the output signal of the primary resonator unit and the output signal of the secondary resonator unit, a tertiary resonator unit, a quaternary resonator unit, and a secondary phase synthesis unit.

13 Claims, 12 Drawing Sheets

U.S. PATENT DOCUMENTS

| | | | |
|---|---|---|---|
| 4,872,765 A | | 10/1989 | Schodowski |
| 4,988,957 A | * | 1/1991 | Thompson et al. ..... 331/107 A |
| 5,004,987 A | | 4/1991 | Hurley |
| 5,160,901 A | | 11/1992 | Stone |
| 5,200,714 A | * | 4/1993 | Hayashi ....................... 331/66 |
| 5,309,116 A | | 5/1994 | Stone |

FOREIGN PATENT DOCUMENTS

| | | |
|---|---|---|
| JP | 2001-308682 | 11/2002 |

OTHER PUBLICATIONS

Watanabe et al.; "Highly Stable and Low Phase-Noise Oven-Controlled Crystal Oscillators (OCXOS) Using Dual-Mode Excitation"; IEICE Transactions on Fundamentals of Electronics, vol. E85-A, No. 2, pp. 329-334; Feb. 2002.

Watanabe et al.; "A Dual Mode Oscillator Based on Narrow-Band Crystal Oscillators with Resonator Filters"; IEEE International Frequency Control Symposium, pp. 932-937; May 1997.

* cited by examiner

PRIOR ART

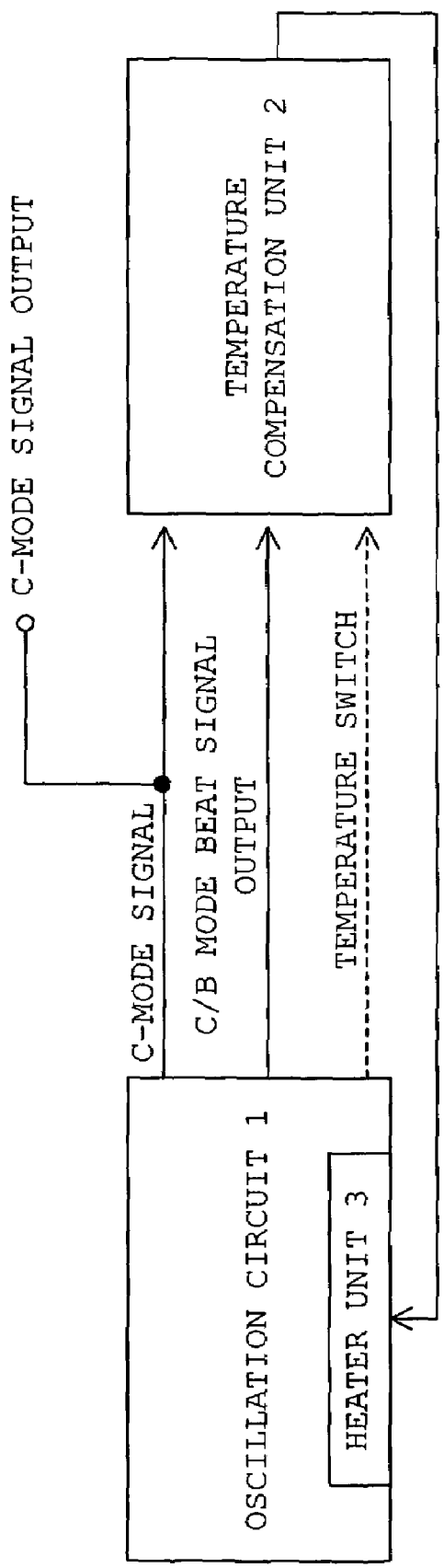
F I G. 2

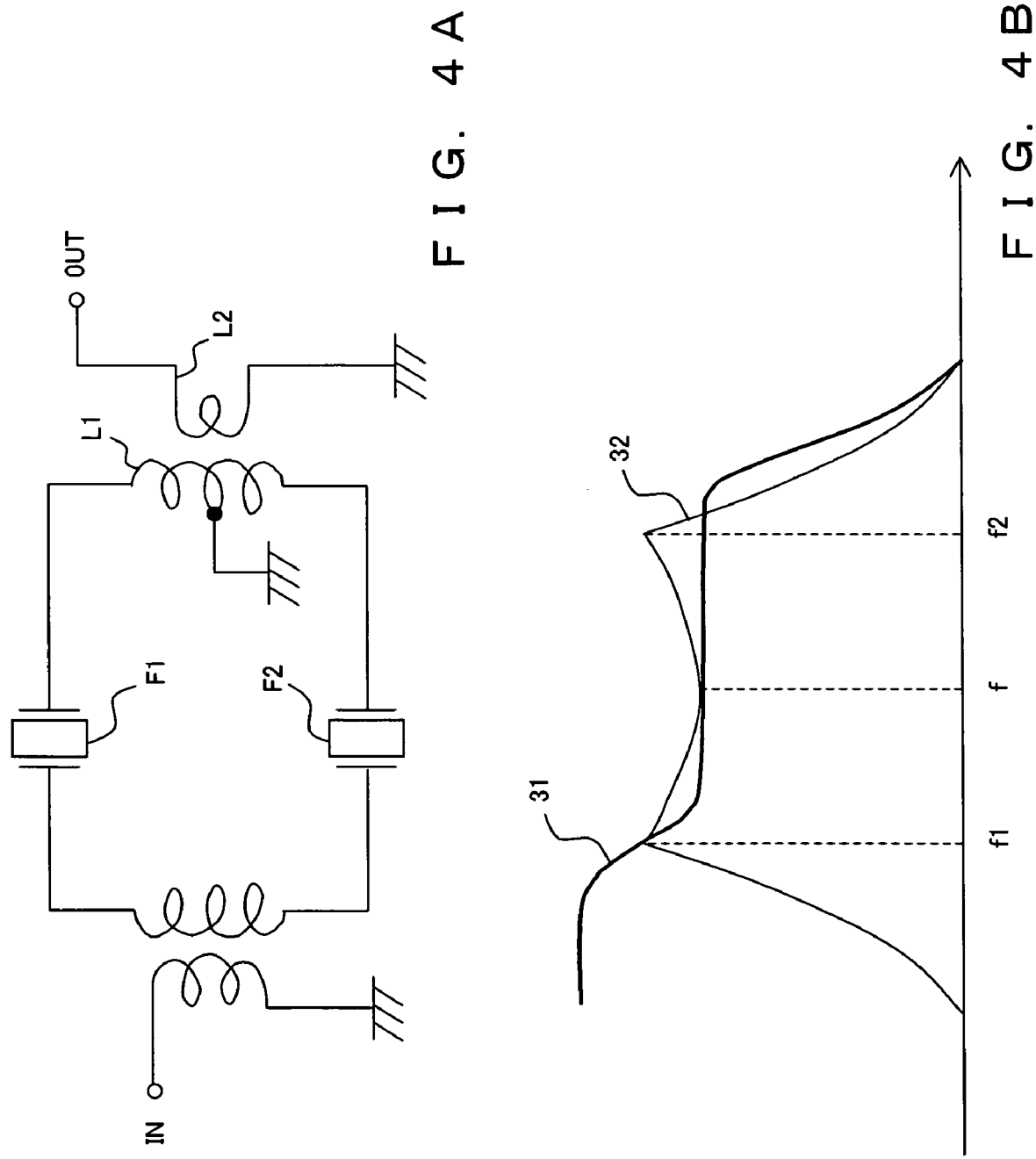

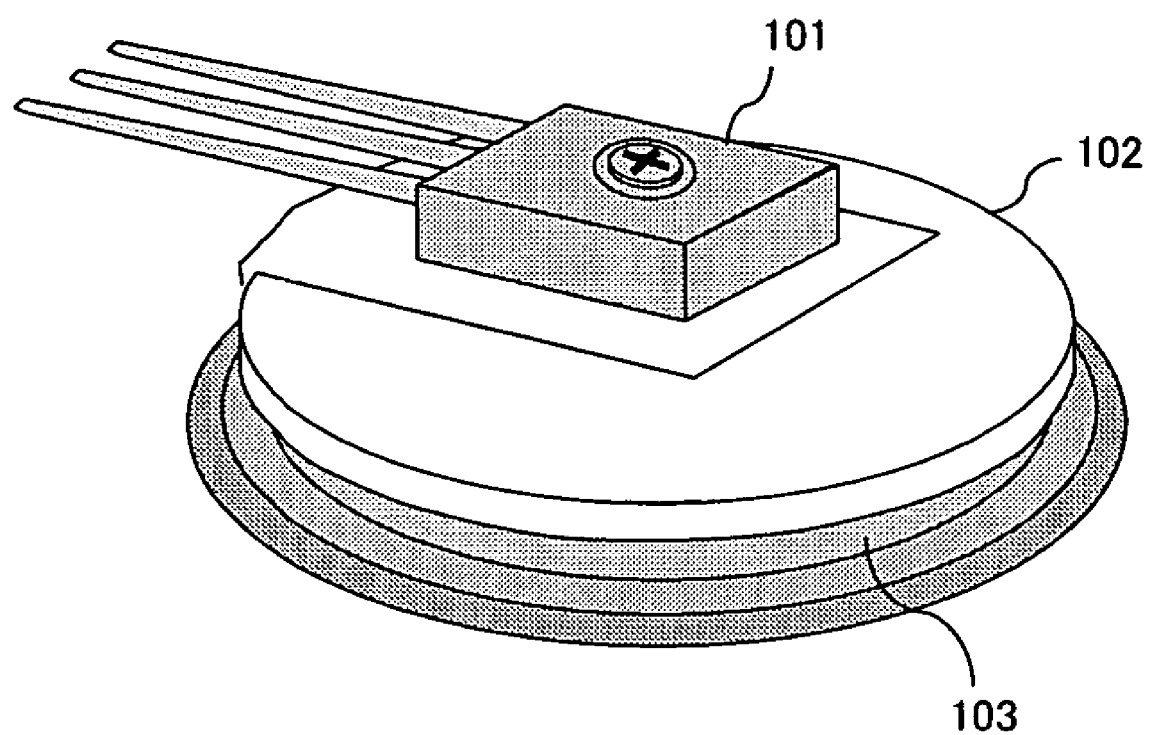
F I G. 1 1

CRYSTAL OSCILLATOR DEVICE, OSCILLATION METHOD AND HEATER

BACKGROUND OF THE INVENTION

1. Field of the Invention

The present invention relates to an oscillator device utilizing a crystal oscillator, more specifically, to a crystal oscillator device, which can simultaneously generate a plurality of signals with different oscillation modes of the crystal oscillator.

2. Description of the Related Art

The crystal oscillator used in oscillator devices generates not only main oscillation but also sub-oscillation. Generally, only the main oscillation of oscillator devices is utilized, and therefore it is required that the sub-oscillation does not cause deterioration of the main oscillation, this is achieved by controlling the sub-oscillation. However, extraction and utilization of the signal of such a sub-oscillation for the purpose of temperature compensation and so forth have been proposed.

It is widely known that the crystal oscillators such as SC-cut and IT-cut crystal oscillators, for example, generate sub-oscillation (B-mode) with a frequency of 9% in higher frequency of resonance frequency of the oscillation mode (C-mode) of the main oscillation. It is proposed in Patent Document 1 (U.S. Pat. No. 4,079,280) that as the frequency of the B-mode signal as a function of temperature is linear, the oscillation frequency of the C-mode can be stabilized by temperature-compensation based on the nature of the functional relationship between the frequency of the B-mode signal and the temperature.

FIG. 1 is a circuit block diagram of the crystal oscillator described in Patent Document 1, etc.

In the oscillator device described in FIG. 1, a feedback signal is provided to an SC-cut crystal oscillator 121 after amplification by amplifier 123. The output from the crystal oscillator 121 is filtered utilizing two filters 122a and 122b, and is output as B-mode and C-mode signals respectively.

The oscillator device in Patent Document 1 can perform more accurate temperature compensation, compared with a method, which estimate the temperature using a temperature sensor equipped by the crystal oscillator, because it can detect the actual temperature of a resonator of crystal consisting the crystal oscillator from the frequency of the B-mode signal with high accuracy.

The oscillator devices, utilizing an AT-cut crystal, in Patent Document 2 (U.S. Pat. No. 4,525,647) and Patent Document 3 (U.S. Pat. No. 4,872,765) simultaneously generate two signals, output from the crystal oscillator device, by two different oscillation modes of an AT-cut crystal, namely thickness shear and face contour oscillation modes.

The method of simultaneously generating a plurality of signals with different oscillation modes of an oscillator is described in the above Patent Documents 2 and 3. However, none of the Patent Documents 1 to 3 describe the detailed configuration of a circuit to realize the simultaneous generation of two modes. For example, in the configuration in Patent Document 1, the signals of the B mode and the C-mode are output separately, as shown in FIG. 1. However, because they are common outputs, the output and the B-mode and C-mode feedback signals of FIG. 1 are in practice the same signal, that is a signal with B-mode and C-mode combined. In order to obtain individual mode signal outputs, the signals should be separated by performing processing on the shared output. In Patent Document 1, however, does not describe any method for so doing.

In Patent Document 2, the configuration of the crystal oscillator comprises, independent terminals for thickness shear oscillations and for contour oscillations, and four input and output terminals. However, in reality such a crystal oscillator does not exist.

When the simultaneous generation of signals with two different oscillation modes from a crystal oscillator is attempted, a see-saw phenomenon in which either one or the other of the signals is generated because of fluctuations in supply voltage and surrounding temperature. The range of supply voltage and surrounding temperature within which the signals of two modes are simultaneously generated is very narrow, and if the temperature or the voltage fluctuate beyond this range, either one of the signals or neither of the signals is generated. Especially, in order to unfailingly generate upon power supply, very difficult fine control is required However, none of the Patent Documents above has any description of a means for addressing the see-saw phenomenon. Therefore with the descriptions of the above Patent Documents, it is difficult to guarantee the stable generation of the signals of two oscillation modes without failure and to maintain the condition as stable as possible.

The temperature compensation of the crystal oscillator, for stabilizing the oscillation frequency of the crystal oscillator, comprises a heater in the proximity of the crystal oscillator, thermally connecting the heater with the crystal oscillator and an oscillation circuit, and maintains a certain high temperature of the heater.

The types of heater used are the rim type, where the heater surrounds the crystal oscillator, and the heat tube type, where the oscillator circuit is sealed inside a metal package and a heater wire is coiled around the package. However, such heaters have a large thermal resistance in the part between the heater and a piece of crystal inside the crystal oscillator package, which is kept at high vacuum, thus thermal efficiency is low and lack long-term stability. Further the complicated assembly increases cost.

SUMMARY OF THE INVENTION

It is an object of the present invention to provide a crystal oscillator device, which enables stable and simultaneous generation of the oscillation signals of two kinds of oscillation modes produced by a crystal unit.

It is another object of the present invention to provide a crystal oscillator device, realizing temperature compensation with good thermal efficiency and highly accurate control.

The present invention is based on the assumption that oscillation signals with a plurality of oscillation modes of a crystal unit are generated simultaneously, and in order to solve the problems mentioned above, the present invention comprises a primary resonator unit, a secondary resonator unit, a primary phase synthesis unit, a tertiary resonator unit, a quaternary resonator unit and a secondary phase synthesis unit.

A primary resonator unit performs filtering of the oscillator signal of a primary oscillation mode, which is one of the oscillator modes, from the output of the crystal unit.

A secondary resonator unit, bearing a different resonant frequency from that of the primary resonator unit, performs filtering of the oscillator signal of a primary oscillation mode from the output of the crystal unit.

A primary phase synthesis unit synthesizes the phases of the output signal of the primary resonator unit and the output signal of the secondary resonator unit.

A tertiary resonator unit performs filtering of the oscillator signal of a secondary oscillation mode, which is one of the oscillation modes, from the output of the crystal unit.

A quaternary resonator unit, bearing a different resonant frequency from that of the tertiary resonator unit, performs filtering of the oscillator signal of a tertiary oscillation mode from the output of the crystal unit.

A secondary phase synthesis unit synthesizes the phases of the output signal of the tertiary resonator unit and the output signal of the quaternary resonator unit.

Such a configuration allows stable oscillation of both oscillation signals of the primary oscillation mode and of the secondary oscillation mode because the signals and their phases, synthesized by the primary phase synthesis unit and the secondary phase synthesis unit, have stable gain and phase to the frequency oscillation.

The primary phase synthesis unit and the secondary phase synthesis unit are realized by a differential amplifier, for example. In such a way, instability caused by temperature fluctuation can be avoided and long-term stability can be achieved.

The primary resonator, the secondary resonator, the tertiary resonator and the quaternary resonator can be directly connected to the crystal oscillator device.

By this configuration for each oscillation mode, the interference between one oscillation mode and another caused by active circuits can be reduced.

The crystal unit is either an SC-cut or an IT-cut crystal unit, and the primary oscillation mode is the C-mode and the secondary oscillation mode is the B-mode This configuration realizes temperature compensation control using the B-mode oscillation signal.

In addition, this configuration does not require an additional mixer but instead, in order to obtain the beat signal, a beat signal extraction unit is comprised, which extracts the B-mode oscillation signal and the C-mode oscillation signal for the purpose of ascertaining the temperature of the crystal unit.

The crystal oscillator device further comprises a temperature compensation control unit, which calculates the value representing the oscillation frequency of the beat signal from the C-mode oscillation signal and the B-mode oscillation signal with reference to the oscillation frequency of the C-mode oscillation signal, executes the temperature compensation control based on the oscillation frequency value of the beat signal when fluctuation of the oscillation frequency value of the beat signal is small, and executes the temperature compensation control based on the oscillation frequency value of the beat signal and a primary specified value when fluctuation of the oscillation frequency value of the beat signal is large.

Such a configuration as briefly described above realizes highly accurate temperature compensation control.

The temperature compensation unit executes temperature compensation control based on a secondary specified value when the oscillation frequency value of the beat signal indicates lower than a temperature 1, and executes the temperature compensation control based on the tertiary specified value when the oscillation frequency value of the beat signal indicates higher than a temperature 2, which is even higher than a temperature 1.

A primary temperature detector unit, which detects whether the temperature in the proximity of the crystal unit is lower than the temperature 1 or not, and a secondary temperature detector unit, which detects whether the temperature in the proximity of the crystal unit is higher than the temperature 2, higher than the temperature 1, or not, can be further comprised. The temperature compensation control unit executes the temperature compensation control based on the secondary specified value when the primary temperature detector unit detects that the temperature in proximity of the crystal unit is lower than the temperature 1, and carries out the temperature compensation control based on the tertiary specified value when the secondary temperature detector unit detects that the temperature in proximity of the crystal unit is higher than the temperature 2.

The above configuration allows temperature compensation control with a high resolution.

The configuration may also comprise a heater unit, installed so as to be in contact with a terminal of the crystal unit and heating the crystal unit through the terminal.

This configuration enables heating of the crystal unit in a thermally efficient manner.

The oscillation method using the crystal unit device and the heater used in the crystal unit are included in the present invention.

According to the present invention, the oscillator signals of two different oscillation modes can be generated simultaneously and stably despite fluctuations of supply voltage and changes in surrounding temperature.

Temperature compensation, which is thermally efficient and enables highly accurate control, can be also realized.

Thus the present invention enables the output of a highly precise frequency signal.

BRIEF DESCRIPTION OF THE DRAWINGS

FIG. 2 is a simplified block diagram of the crystal oscillator of the illustrated embodiment;

FIGS. 4A and 4B show the signal characteristics of a phase-synthesized signal element filtered by two filters;

FIG. 11 illustrates a configuration, in which the power transistor driving the heater is in thermal contact with the crystal unit.

DESCRIPTION OF THE PREFERRED EMBODIMENT

In the following description, details of one embodiment of the oscillator of the present invention are set forth with reference to drawings. The following description is based on an example configuration of an SC-cut or an IT-cut crystal oscillator, which simultaneously generates C-mode and B-mode signals, executes temperature compensation using the B-mode output signal, and outputs the C-mode signal with high frequency precision. However, the crystal oscillator of the present invention is not limited to SC-cut or IT-cut crystal oscillators but can be adopted for use with any oscillators which generate a signal with a plurality of oscillation modes in general, for example, crystal oscillators with different plate cut geometries, such as the signals of the fundamental frequency mode and the third harmonic frequency mode of an AT-cut crystal oscillator.

FIG. 2 is a simplified block diagram of the crystal oscillator of the illustrated embodiment.

The crystal oscillator of the illustrated embodiment comprises a oscillator circuit 1 and a temperature compensation unit 2, and the temperature compensation unit 2 controls the temperature of each elemental device comprising the oscillation circuit 1 and its crystal oscillator by controlling a heater unit 3 based on a C-mode output signal (hereinafter referred to as the C-mode signal), and the beat signal of a B-mode output signal (hereinafter referred to as the B-mode is signal) and C-mode signal(hereinafter referred to as the C/B mode beat signal), are all generated by the oscillator circuit 1 (when the oscillator circuit 1 comprises a temperature switch, as described later, the output from the temperature switch is also taken into account).

Figure 1:
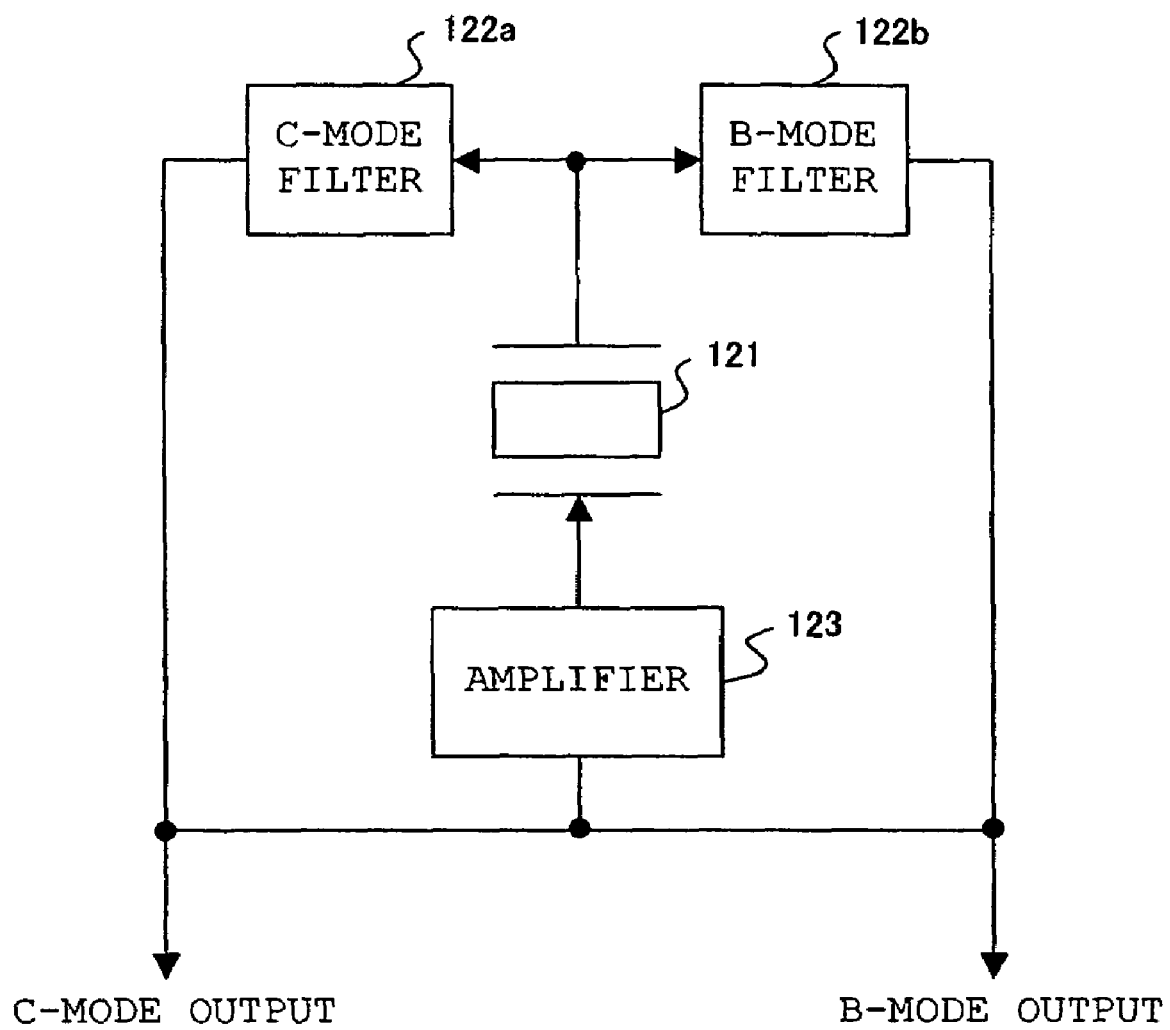
FIG. 1 is a circuit block diagram of the crystal oscillator described in Patent Document 1.
Figure 3:
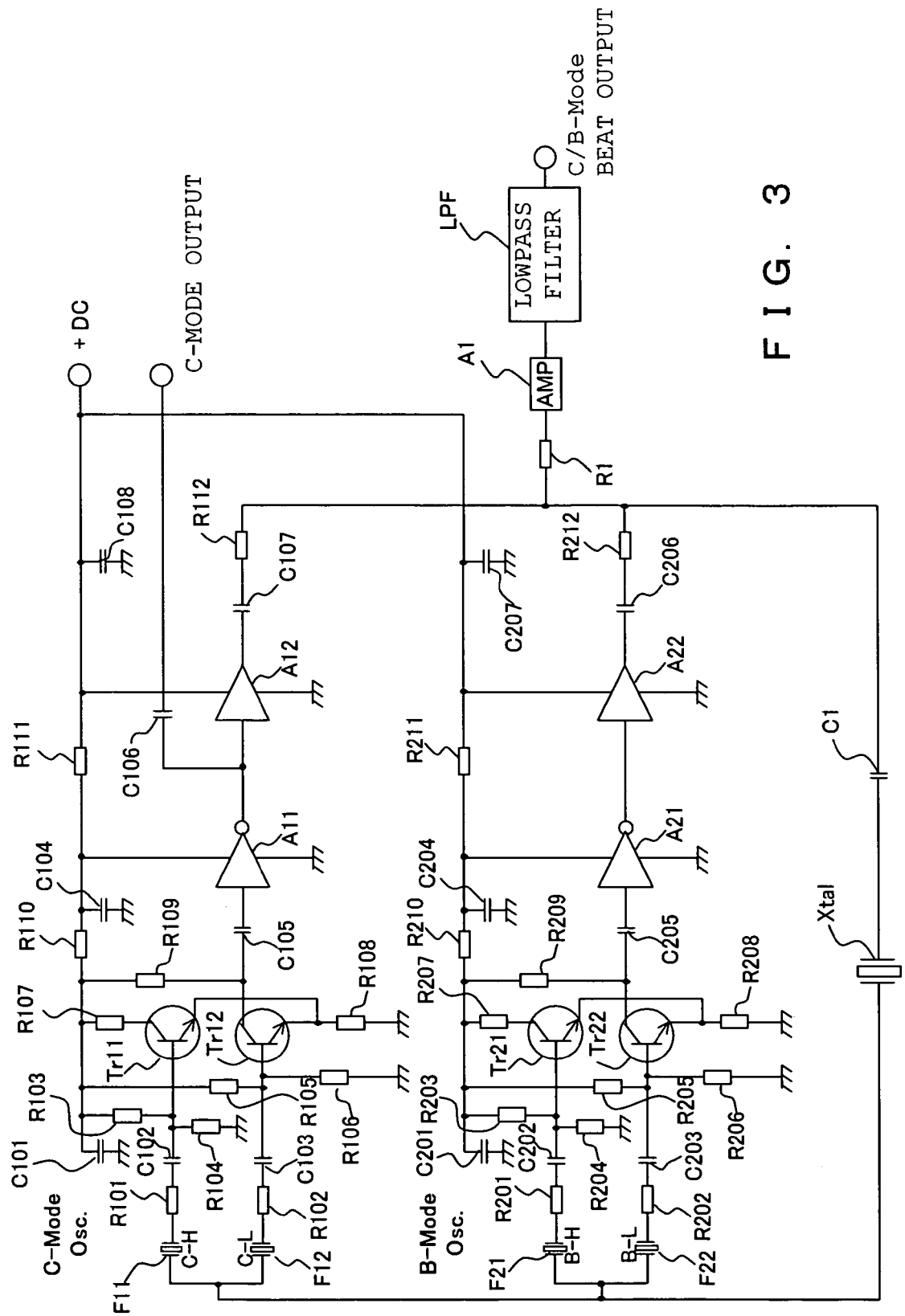
FIG. 3 is a schematic of an example of configuration of the oscillator circuit.

FIG. 3 is an example of configuration of the oscillation circuit 1.

The crystal oscillator of the illustrated embodiment is directly connected to the crystal oscillator, and inputs the signal element passing through the SC-cut or the IT-cut crystal oscillator Xtal without involving any active device such as an amplifier. Such a configuration reduces the intervention, caused by active circuits, between the circuit for the B-mode signal and the circuit for the C-mode signal. If the input terminal of a feedback loop in the oscillator circuit has the configuration with active devices, as one oscillation mode signal input increase, the output level of the other mode signal decreases, failing to maintain stable oscillation of both modes. On the contrary, even though one mode signal input increases, the oscillation circuit 1 of FIG. 3, enables the maintenance of a constant output level of the other mode signal by directly connecting the output of the crystal oscillator Xtal and the crystal oscillator.

Two crystal resonators are comprised in each of the B-mode and the C-mode. A constant phase and gain are obtained even during frequency fluctuation, by synthesizing the phases of the output signals from these two crystal resonators. As a result, two constant signals are output from start up without producing the see-saw phenomenon even if the temperature or the supply voltage fluctuate.

FIG. 3 illustrates a configuration including a C-mode oscillator circuit on top and a B-mode oscillator circuit below. The C-mode signal generated by the circuit on top is output as an oscillation signal. At the same time, the C-mode signal and the B-mode signal generated by the circuit below are loosely coupled by resistor R1 and amplified by an amplifier A1. Then the high-frequency signals such as the B-mode and C-mode signals remaining in the coupled signal are removed, and the product, the C/B mode beat signal, is output to the temperature compensation unit 2.

In the configuration of the C-mode oscillator circuit shown in FIG. 3, the output of the crystal oscillator Xtal is connected to parallel crystal resonators F11 and F12. The outputs of crystal resonators F11 and F12 are connected to the bases of transistors Tr11 and Tr12 after passing through input resistors R101 and R102 and capacitors C102 and C103, respectively. The emitters of the transistors Tr11 and Tr12 are connected to each other, and together connected to ground through a resistor R108. The collector of the transistor Tr11 is connected to a voltage source +DC through resistor R107. The collector of the transistor Tr12 is connected to the input of an inverting amplifier A11 through a capacitor C105. The output of the inverting amplifier A11 is applied to a non-inverting amplifier A12 and a capacitor C106. The C-mode signal is output from the other side of the capacitor C106. The output of the noninverting amplifier A12 is connected to a resistor R1 through a capacitor C107 and a resistor R112, and is connected to the crystal oscillator Xtal through a capacitor C1.

Resistors R103, R104 and R107 are bias resistors used to bias the transistor Tr11, resistors R105, R106 and R109 to bias transistor Tr12, and resistor R108 to bias both transistors Tr11 and Tr12. A resistor R101 is the input resistor of the transistor Tr11, and a resistor R102 is the input resistor of the transistor Tr12. Capacitors C102, C103, C105, C106 and C107 are coupling capacitors for blocking DC and permitting the input of AC. Capacitors C101, C104 and C108 are bypass capacitors for the power source.

In such a configuration, the signal from the crystal oscillator Xtal is filtered by passing through the crystal resonators F11 and F12. The output is phase-synthesized by a differential amplifier comprised of two transistors Tr11 and Tr12. The signal, which meets one of the generation requirements, that is the feedback signal has the same phase as the original signal, is amplified with a phase shift of 180 degrees by an inverting amplifier A11. The output of the inverting amplifier A11 with any DC component removed by the capacitor C106 is provided as the C-mode signal output of the oscillation circuit 1. The output of the inverting amplifier A11, split from the C-mode signal by the noninverting amplifier A12, is applied to a resistor R1 through the capacitor C107 and a resistor R112, and loosely coupled to the B-mode signal from the circuit comprising the lower half of FIG. 3 and resulting in generation of the C/B mode beat signal.

The lower half configuration of the B-mode oscillator circuit is much the same as that of the C-mode oscillator circuit. The crystal resonators F21 and F22 are equivalent to the crystal resonators F11 and F12 of the C-mode oscillator circuit, and transistors Tr11 and Tr12 are equivalent to the transistors Tr21 and Tr22 of the C-mode oscillator circuit. The amplifiers A21 and A22 are equivalent to the amplifiers A11 and A12. The bias resistors R203~R209 are equivalent to the bias resistors R103~R109. The resistors R210~R212 are equivalent to the resistors R10~R112. The coupling capacitors C202, C203, C205, and C206 are equivalent to the coupling capacitors C102, C103, C105 and C107, and the source bypass capacitors C201, C204 and C207 are equivalent to the capacitors C101, C104 and C108.

The B-mode output signal from the amplifier A22, after being passed through the capacitor C206 and the resistor R212, is loosely coupled to the C-mode output signal from the amplifier A12, similarly passed through the capacitor C107 and the resistor R112, by the resistor R1. After being amplified by the amplifier A1 and having the high-frequency signals such as B-mode and C-mode signals remaining in the beat signal removed by a lowpass filter LPF1, the signal is output by the oscillator circuit 1 as the C/B mode beat signal output.

In order to perform temperature compensation, a mixer circuit is required to generate the C/B mode beat signal, which is the difference generated by mixing the C-mode signal and the B-mode signal, to measure frequency fluctuations of the B-mode signal based on the C-mode signal, which has a highly stable frequency, as a time base. However, in the illustrated embodiment, the C/B mode beat signal can be obtained from the oscillation circuit 1, therefore it is not necessary to comprise any mixer circuit external to the oscillator circuit 1.

The circuit in FIG. 3 stabilizes and outputs the two signals by inputting the output of the crystal oscillator to two crystal resonators F11 (F21) and F12 (F22) in each of the C-mode oscillation circuit and the B-mode oscillation circuit, and phase-synthesizing the output passed through the crystal resonator.

FIGS. 4A and 4B show the signal characteristics of a phase-synthesized signal element filtered through the two crystal resonators F1 and F2.

The oscillation circuit 1 in FIG. 3, using two crystal resonators for each of the B-mode and the C-mode circuits in order to consist filters, synthesizes the phases of the outputs from each circuit.

FIG. 4B shows the phase curve 31 and gain curve 32 of the output signal OUT when the filtered outputs of the crystal resonators F1 and F2 are phase-synthesized using coils L1 and L2 as described in FIG. 4A. The frequency of the input signal IN is on the horizontal axis, and the level of the phase and the gain of the output signal OUT is on the vertical axis.

The center frequency of the resonator F1 in FIG. 4A is f1 and the center frequency of the resonator F2 in FIG. 4A is f2. The range over which the phase 31 and the gain 32 are stable can be configured over a wide frequency range between the frequencies f1 and f2 as in FIG. 4B. Consequently, even if the frequency of the input signal IN changes because of fluctuations in supply voltage and temperature, stable signal generation can be obtained, and the see-saw phenomenon can be prevented as long as the frequency of the input signal IN lies between the frequencies f1 and f2. For that reason, the resonant frequencies f1 and f2 should be selected so that the frequencies of the B-mode and the C-mode signals lie around the center f of the frequency range f1 through f2, and that the both modes can be kept within the range in which the phase and the gain are constant even if the frequencies of the B and C-mode signals are changed by perturbations in the temperature or supply voltage (i.e. between frequencies f1 and f2).

In the circuit of FIG. 3, the crystal resonators F11 and F12 are selected so that the frequency of the C-mode signal lies between the center frequency f11 of the crystal resonator F11 and the center frequency f12 of the crystal resonator F12, even if the frequency of the C-mode signal varies due to fluctuations in the temperature or supply voltage. In a similar way, the crystal resonators F21 and F22 are selected so that the frequency of the B-mode signal lies between the center frequency f21 of the crystal resonator F21 and the center frequency f22 of the crystal resonator F22, even if the frequency of the B-mode signal varies. By this configuration, the generation requirements, which are for stabilizing the phase and the gain of the feedback signal, are satisfied; therefore the oscillator circuit 1 enables the stable generation of signals with two kinds of oscillation modes.

In the circuit of FIG. 3, the phase synthesis does not employ inductors but a differential amplification circuit of the transistors. Such a configuration avoids the instability caused by temperature perturbations when inductors are used, provides long-term stability and thus allows the circuit to realize and to maintain stable simultaneous generation on and after start-up.

The B-mode signal requires phase synthesis of signals from two oscillators because of the possibility of large frequency fluctuations. However, as the C-mode signal has small frequency fluctuations phase synthesis as described above is not required, and a configuration in which the output of the crystal oscillator Xtal is filtered using a filter whose center frequency is the frequency of the C-mode signal can be used.

Also, the circuit in FIG. 3 utilizes crystal resonators for oscillators F11, F12, F21 and F22, however a material, with appropriate temperature characteristics and which, provides a high enough Q, such as a monolithic crystal filter, can be used as a substitute.

Figure 5A:
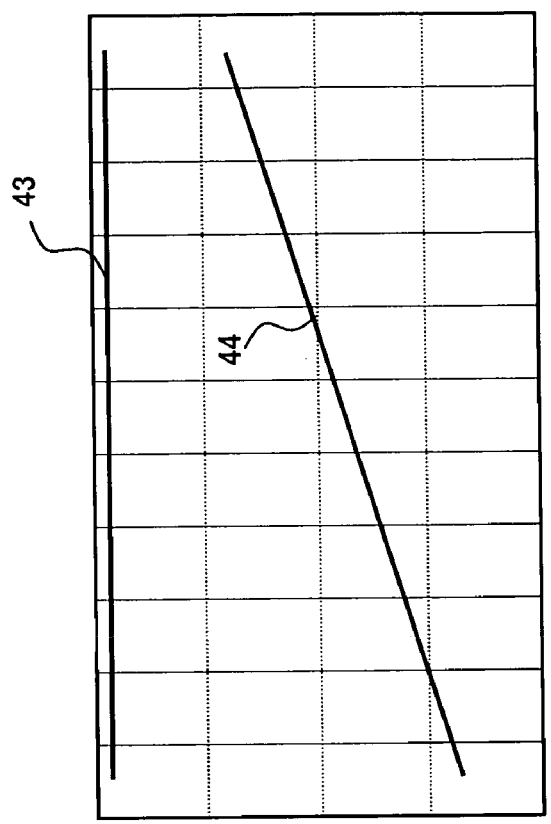
FIGS. 5A and 5B show the characteristics of the amplifier circuit of the oscillator circuit of the illustrated embodiment.
Figure 5B:
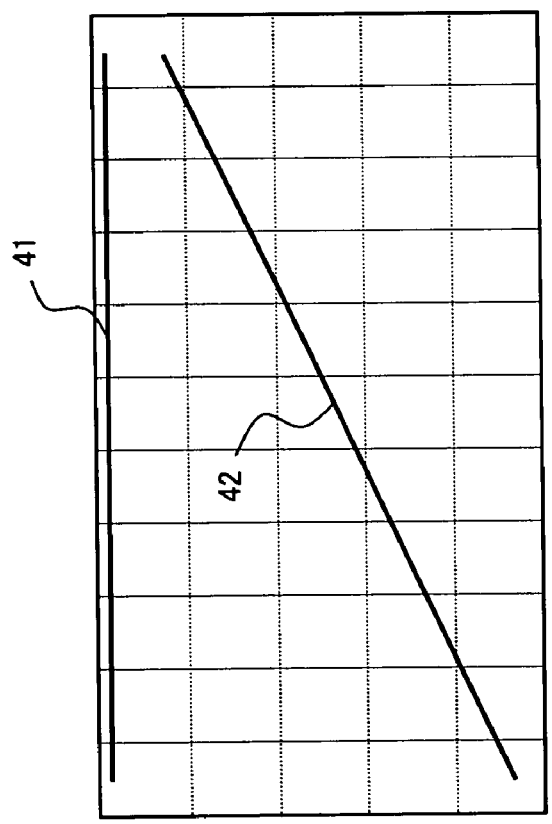

FIGS. 5A and 5B show the characteristics of the amplifier circuit of the oscillator circuit 1 of the illustrated embodiment.

FIG. 5A shows the characteristics of the amplifier circuit of the C-mode oscillator circuit, and FIG. 5B shows the characteristics of the amplifier circuit of the B-mode oscillator circuit.

FIG. 5A indicates the change in the C-mode output when the input level of the B-mode signal is changed. The graph of FIG. 5A has the level of the B-mode input signal on the horizontal axis and the levels of the B-mode and the C-mode output signals on the vertical axis. The curve 42 represents the level of the B-mode input signal, and the curve 41 represents the level of the C-mode output signal.

In the oscillator circuit 1 of FIG. 5A, the output level 41 of the C-mode signal is constant, and is unaffected by the increase in the input level 42 of the B-mode signal.

FIG. 5B indicates the change in the B-mode output when the input level of the C-mode signal is changed. The graph of FIG. 5B has the level of the C-mode input signal on the horizontal axis and the levels of the B-mode output and the C-mode output signals on the vertical axis. The curve 43 represents the level of the B-mode output signal, and the curve 44 represents the level of the C-mode input signal.

From FIG. 5A and FIG. 5B, it is shown that the level 43 of the B-mode output signal is constant even if the level of the C-mode input signal is changed, and thus that variation in the level of the C-mode input signal does not affect the level 43 of the B-mode output signal.

In the crystal resonator of the illustrated embodiment, as explained above, the resonator F21 and F22 of the B-mode signal and the resonator F11 and F12 of the C-mode signal have different impedances. Because one has a higher impedance than the other, the resonator F11 and F12 perform filtering separately. Therefore, change in the input level of one signal does not affect the output level of the other signal.

In the following description, temperature control by the temperature compensation unit 2 is explained.

The temperature compensation unit 2 controls the temperature of a piece of crystal consisting the crystal unit Xtal in the oscillator circuit 1 by using the C-mode signal and the C/B mode beat signal from the oscillator circuit 1.

Figure 6:
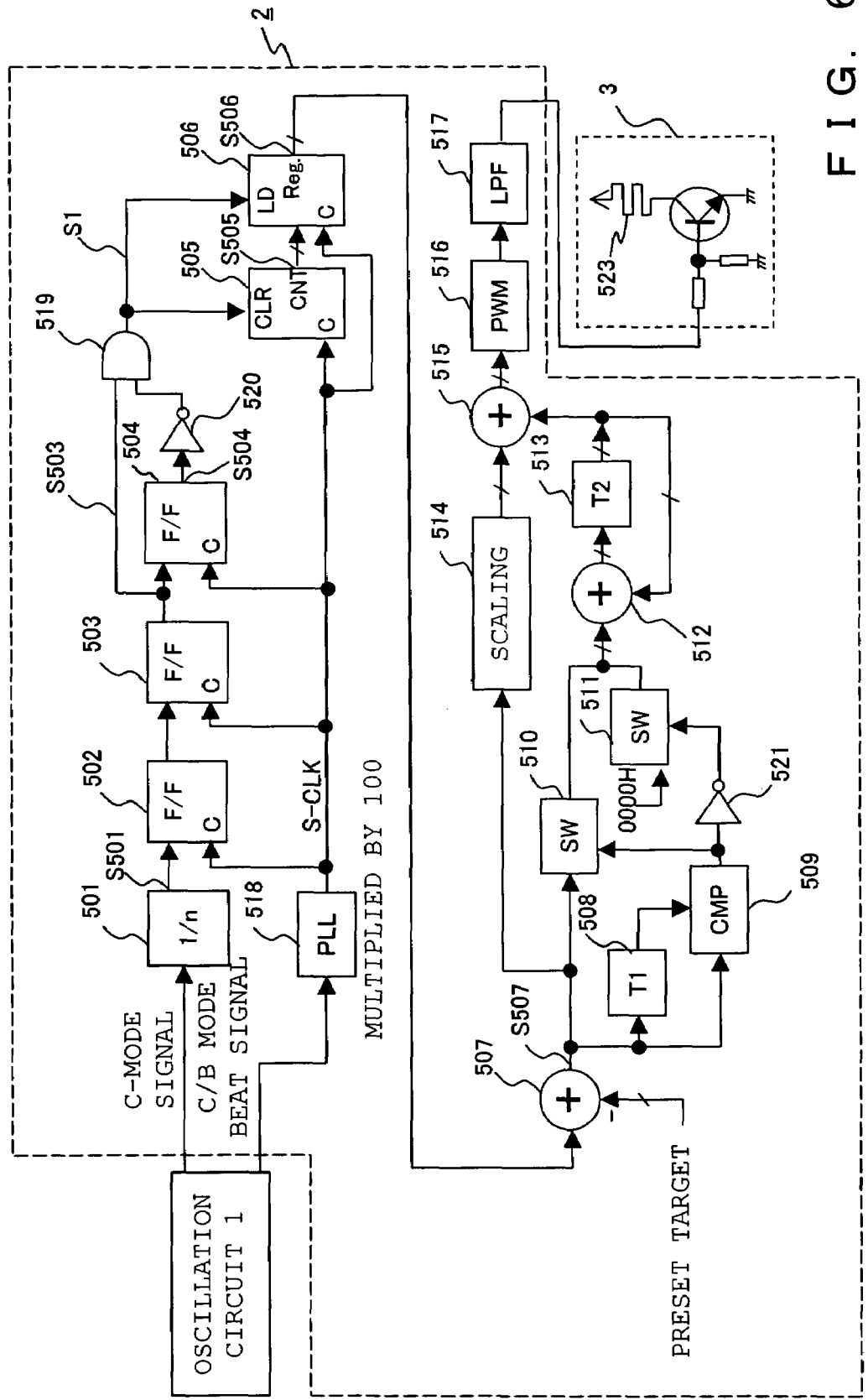
FIG. 6 is a block diagram illustrating a control circuit of the temperature compensation unit.

FIG. 6 is a block diagram illustrating the control circuit of the temperature compensation unit 2.

In the illustrated embodiment, the C/B mode beat signal is counted with reference to the C-mode signal as the clock signal, and the count during a certain time period is accumulated by an integrator. According to the accumulated count, the transistor driving the heater unit 3 is under PWM control.

Generally, the temperature is low on start-up. The cumulative sum of the count resulting from the low temperature on start-up would cause a bias in the cumulative sum and consequently, accurate control would not be achieved.

The control circuit in FIG. 6 addresses this problem by waiting until the temperature reaches a predetermined target temperature before the integrator calculates the cumulative sum. The cumulative sum calculated after the temperature exceeds the target temperature is not subject to the above bias and thus accurate temperature control is realized.

The following explanation assumes that the C-mode signal is 5 MHz, and 16-bit processing is performed in the temperature compensation unit 2 of FIG. 6.

In the temperature compensation unit 2 of FIG. 6, the C-mode signal from the oscillator circuit 1 is divided into 1/n (=$2^{15}$=32768) by a frequency divider 501, and a time interval signal for counter S501 is generated. An S-CLK is obtained by using a PLL multiplier 518 to multiply the frequency of the C/B mode beat signal of the oscillator circuit 1 by 100. By counting the S-CLK with a counter 505, the temperature is calculated and a heater 523 in heater unit 3 can be controlled.

The S-CLK signal and the output of the divider 501 (S501) are asynchronous. In order to synchronize these two signals, flip-flops 502~504, connected in series, are used. S501 is input to the flip-flop 502, the S-CLK is input from each clock input, then the signal S503 is obtained from the output of the flip-flop 503. The output of the flip-flop 503 (S503) is delayed for one signal period of the S-CLK by applying it to the flip-flop 504, which operates with the S-CLK as a clock signal. The output signal S504 of the above operation is inverted by a NOT gate 520, and is ANDed with S503 by AND gate 519. The obtained signal S1 serves as the clear signal of a counter 505 and the load signal of a register 506.

The counter 505 clears the count of S-CLK every time the clear signal S1 is input. The clear signal S1 is the load signal of the register 506, therefore the S-CLK is counted for one signal period of the signal S1, and the count is provided to an adder 507 by the register 506 as a multiplied clock counter output holding signal S506.

The adder 507 subtracts the preset target value from the count S506 held in the register 506, and outputs the result S507 in two's complement. This value is provided to a register 508, which stores the latest data, a comparator 509 and a bit scaler 514.

The comparator 509 compares the latest data output from the register 508 and the preset data output from the adder 507. When the high side 8 bits of 16-bit operation match, the comparator 509 outputs logic H, and when they do not match, it outputs logic L.

When logic H is output by the comparator 509, a switch 501 turns ON, the output S507 of the computing unit 507 is provided to an adder 512. When logic L is output by the comparator 509, a switch 511 turns ON, the center value of the two's complement 0000H is input to a computing unit 512. Consequently, 0000H is input to the adder 515, when the change in the output S507 of the adder 507 is large, and a difference in the high side 8 bits of the latest data set in the register 508 is caused. The output S507 is input to the adder 515, when the change in the output S507 of the adder 507 is small keeping the same high side 8 bits of the latest data set in the register 508.

An adder 512 and a register 513 comprise an integrator, which sums the latest data output from the register 513 and the output from the switch 510 or the switch 511. The result is provided to the adder 515 as well as set in the register 513 for integration operation. At a time, when the result of the comparison by the comparator 509 is that the high side 8 bits do not match as explained above, the center value 0000H of the two's complement is input to the computing unit 512 and integrating processing is performed. The update period of the data in the register 513 is calculated from the C/B mode beat signal and a thermal response time constant.

The scaler 514 performs scaling by shifting and multiplying the 16-bit value, which is in the difference data output on start-up from the computing unit 507, within the range that does not cause overflow errors. The output of the scaler 514 and the output of the register 513 are added, and the result is provided to a pulse width modulator 516. Based on the input, the pulse width modulator 516 modulates the pulse width, that is, to increase and decrease the number of pulses at random within a certain time period. The modulated signal is converted into the analog signal by the lowpass filter 517, and the modulator drives the heater by inputting the modulated signal to the power transistor of the heater unit 3.

In the above example, the analog signal controlling heater input of the heater unit 3 is generated using the pulse width modulator 516 and the lowpass filter 517. However, a D/A converter can be used to convert the output of the computing unit 515 into analog data.

In this way, the temperature compensation unit 2 of the illustrated embodiment performs integration operation, accounting for the fact that the temperature on start-up is far from the target temperature. Therefore, it quickly reaches the target frequency, and achieves highly accurate temperature control. And it is not necessary a fine adjustment to the low pass filter 517 and an analog portion of the heater unit.

The following description is an explanation of the second embodiment of the temperature compensation unit 2.

Figure 7:
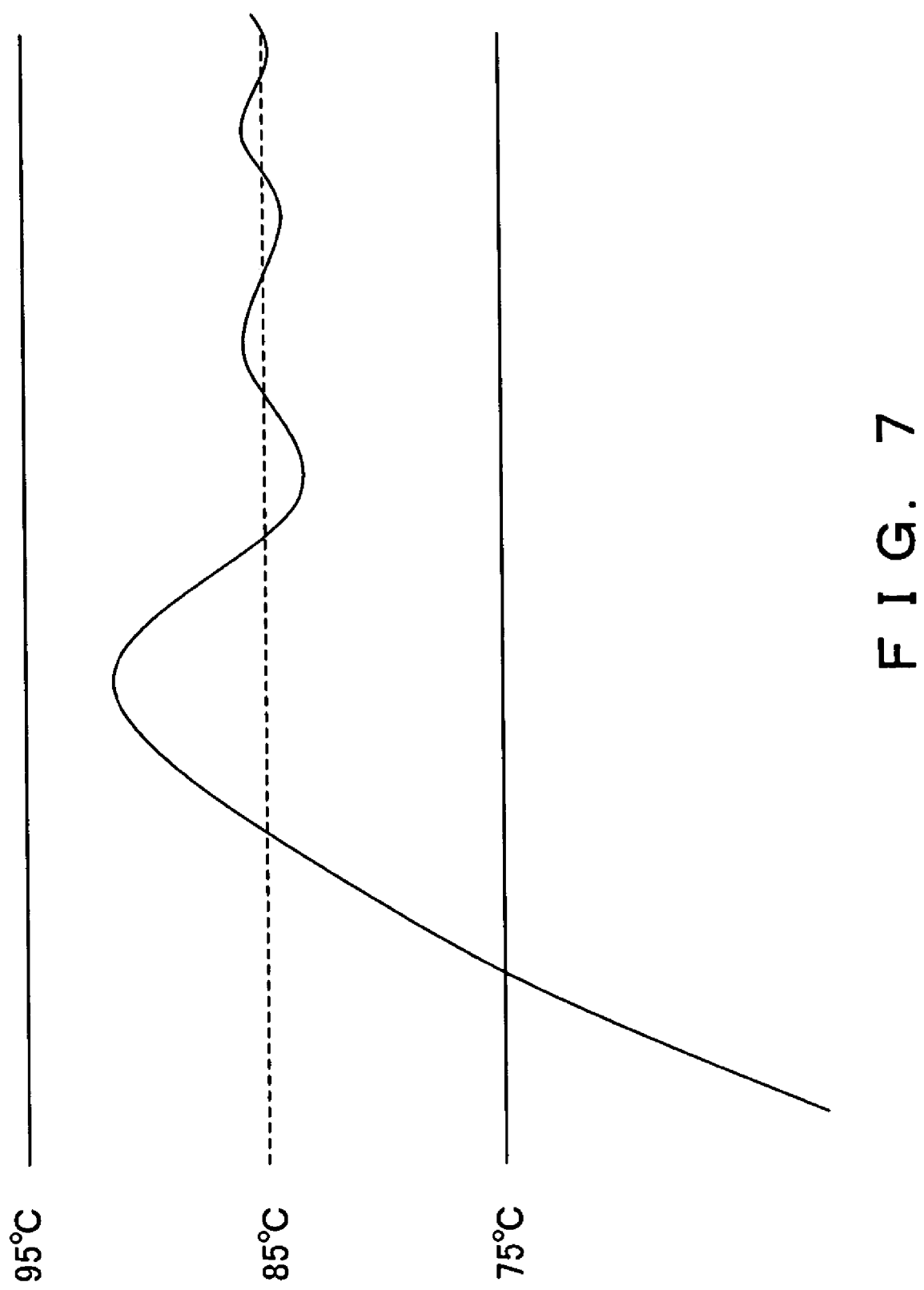
FIG. 7 shows temperature control by the temperature control unit.

FIG. 7 shows temperature control by the temperature control unit 2.

In FIG. 7, the target temperature is set at 85° C., and the temperature compensation unit 2 controls the heater based on the C/B mode beat signal of the oscillator circuit 1. When the temperature is controlled from start-up the temperature is low and the resolution of control is low because it takes some time for the temperature to reach the target temperature and the range to be controlled is wide.

The temperature compensation unit 2 of the second embodiment addresses this problem. The heater is driven at full power from start up until the temperature reaches the predetermined target temperature (85° C. in FIG. 7). When the temperature reaches the predetermined temperature 1 (75° C. in FIG. 7), accurate control of the temperature based on the C/B mode beat signal is performed. As soon as the temperature surpasses the predetermined temperature 2 (95° C. in FIG. 7), the heater is turned off so that the temperature drops below the predetermined temperature 2 (95° C.).

Figure 8:
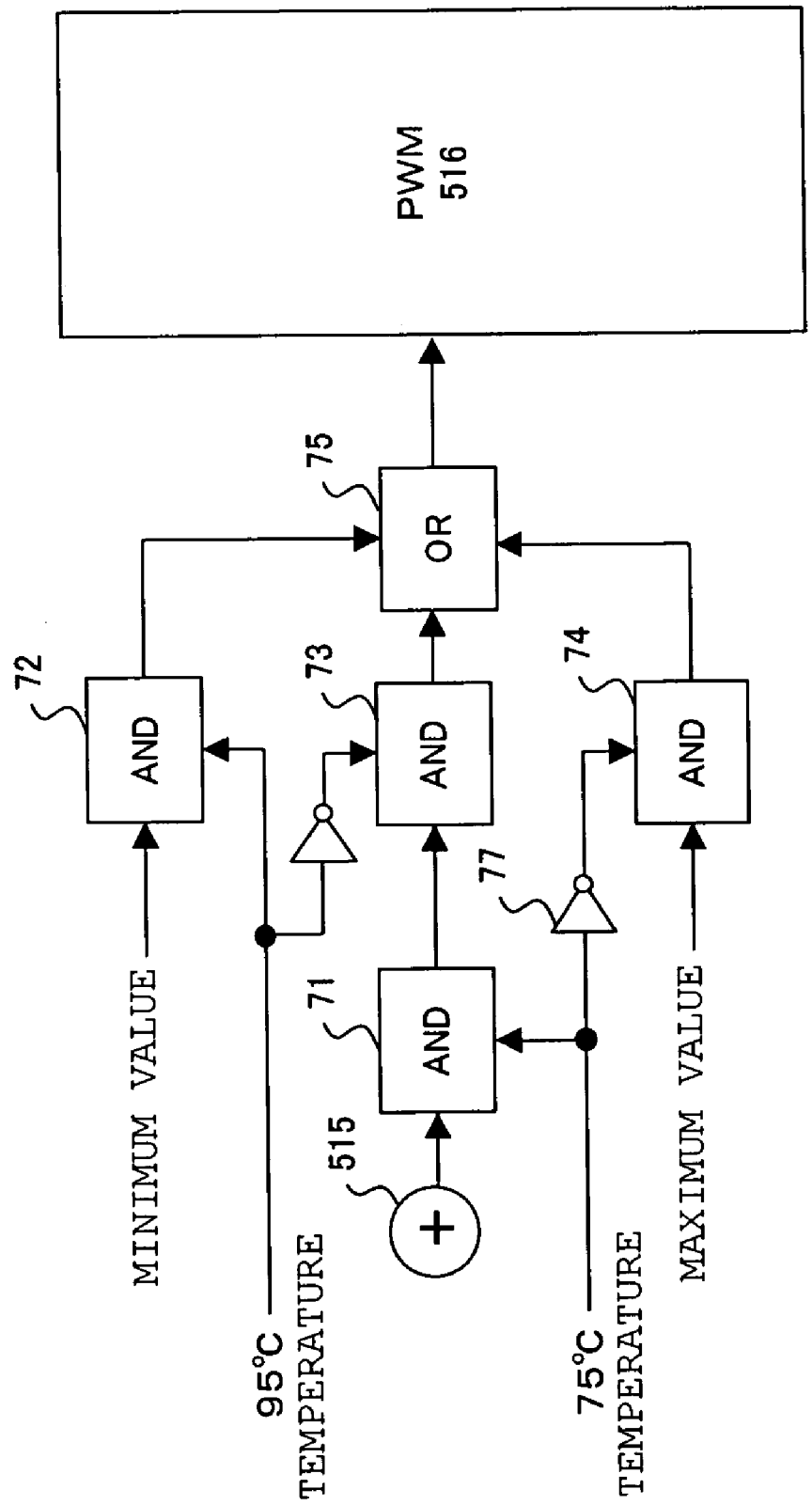
FIG. 8 describes a configuration of the temperature compensation unit of the second embodiment.

FIG. 8 describes a configuration of the temperature compensation unit 2 of the second embodiment.

In the second embodiment, a temperature switch for 95° C. and a temperature switch for 75° C. are arranged near the crystal oscillator Xtal of the oscillator circuit 1. The temperature compensation unit 2 executes temperature control by further using the outputs from these switches.

In addition to the configuration shown in the first embodiment in FIG. 6, the temperature compensation unit 2 of the second embodiment further comprises configuration elements shown in FIG. 8 between the adder 515 and the pulse width modulator 516.

The 95° C. temperature switch and the 75° C. temperature switch output the logic H when the temperature exceeds 75° C. (95° C.), and otherwise output the logic L. When the temperature is below 75° C., L is output from both the 75° C. temperature switch and the 95° C. temperature switch. The maximum value is output from AND gate 74 to OR gate 75 and 0 is output from AND gates 72 and 73 to OR gate 75. Then the maximum value is input to the pulse width modulator 516, and the heater is fully driven.

When the temperature is higher than 95° C., H is output from both the 75° C. and the 95° C. switches, therefore the OR gate 75 receives the minimum value from the AND gate 72 and 0 from the AND gates 73 and 74. Then the minimum value is input to the pulse width modulator 516, and heating by the heater is minimized.

When the temperature is between 75° C. and 95° C., H is the output of 75° C. temperature switch and L is the output of 95° C. temperature switch. The output of the adder 515 is input from the AND gate 73 to the OR gate 75, 0 is input from the AND gates 72 and 74, and the output of the adder 515 is input to the pulse width modulator 516. Under these conditions the temperature compensation unit 2 performs control similar to the control shown as in the first embodiment described above, and based on the C/B mode beat signal, and accurate temperature control is achieved.

Figure 9:
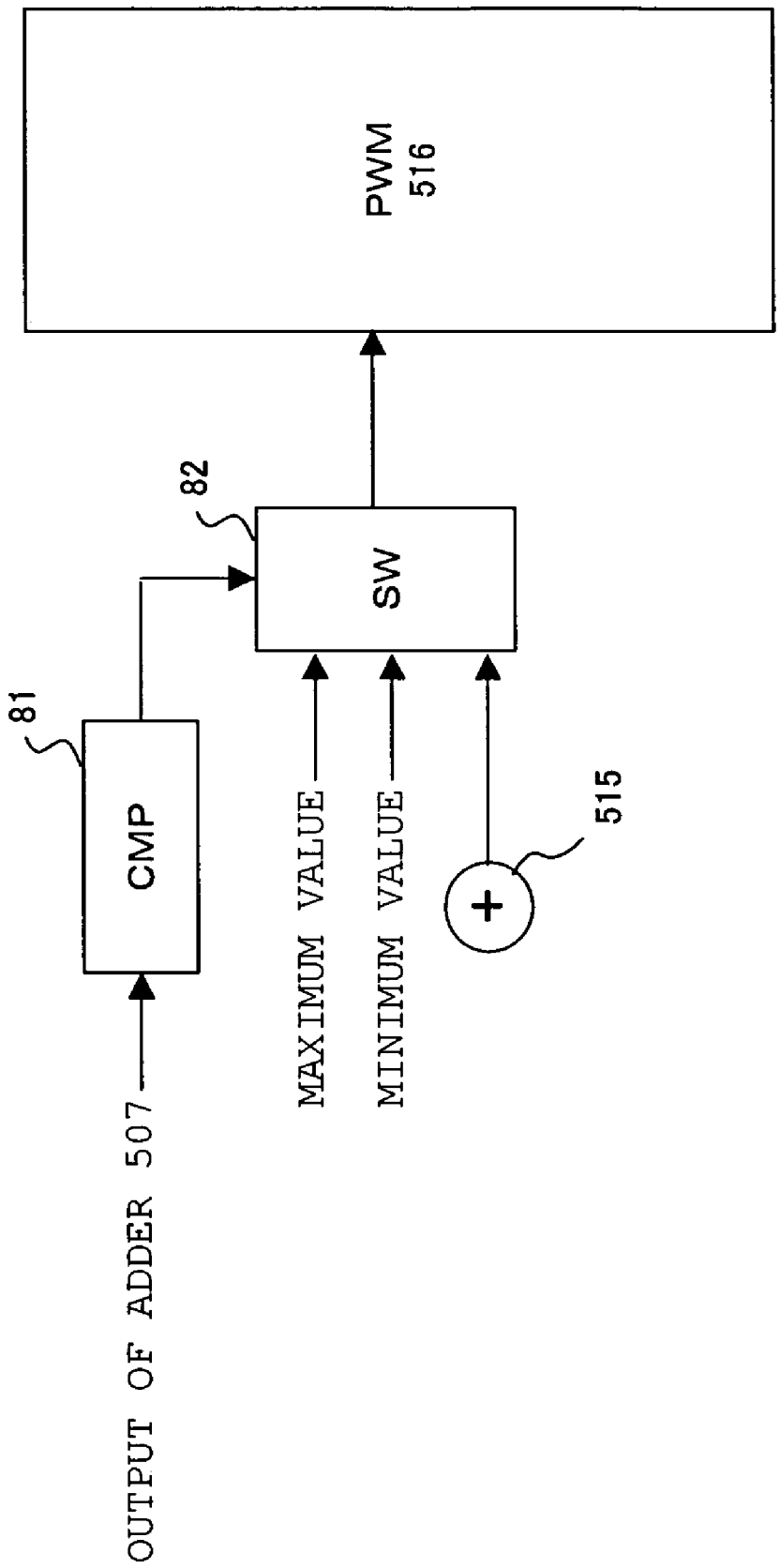
FIG. 9 shows a configuration of the temperature compensation unit of the second embodiment.

FIG. 9 shows a configuration of the temperature compensation unit 2 of the second embodiment.

In the third embodiment, control similar to the second embodiment is realized without comprising any temperature switch in the oscillator circuit 1.

The temperature compensation unit 2 of the third embodiment, in addition to the configuration shown in FIG. 6, further comprises configuration elements described in FIG. 9 between the adder 515 and the pulse width modulator 516.

In the third embodiment, the output of the switch 82 is controlled by a comparator 81 based on the output of the adder 507. The comparator 81 causes the switch 82 to output the maximum value when the temperature, which the C/B mode beat signal in the output S507 of the adder 507 indicates, is lower than 75° C., the output of the adder 515 when it is between 75° C. and 95° C. and the minimum value when it is higher than 95° C. The pulse width modulator 516 drives the heater according to the output of the switch 82.

Such configuration allows the third embodiment to perform accurate control, in the same way as the second embodiment without the temperature switches in the oscillation circuit 1, by the C/B mode beat signal within the range of 75~95° C. At the temperature lower than 75° C. or higher than 95° C., heater is driven by a specified value so that the desired temperature can be obtained quickly, and the narrow temperature range can be controlled with high resolution and high accuracy.

The following description provides an explanation of the heater unit 3 of the crystal oscillator of the illustrated embodiment.

Figure 10:
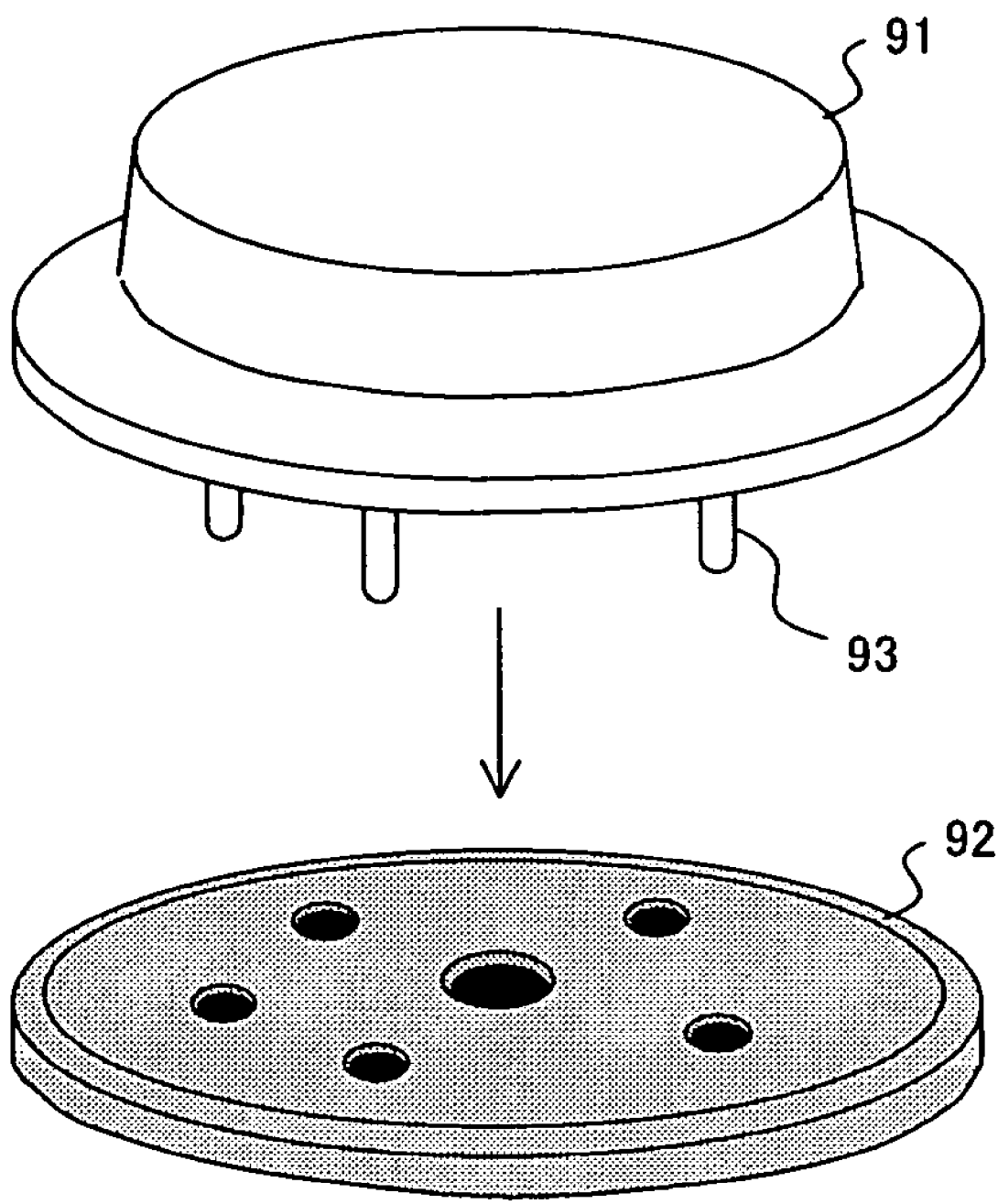
FIG. 10 is a drawing of the configuration of the heater used in the crystal unit of the illustrated embodiment.

FIG. 10 is a drawing of the configuration of the heater used in the crystal oscillator of the illustrated embodiment.

In the crystal oscillator of the illustrated embodiment, for the purpose of improvement of the thermal efficiency in the heater 3, a disk heater 92 is fixed to a part comprising terminals, such as the base of the crystal unit 91, which is the part in closest thermal contact to a piece of crystal or the part with the lowest thermal resistance. A disk heater 92 is adjusted to have the same shape as the aforementioned part and is fixed to it using an adhesive sheet with high thermal conductivity such as aluminum nitride. By so doing, the heat from the disk heater 92 is directly conducted from the terminal 93 of the crystal oscillator 91, which has high thermal conductivity to a piece of crystal, thus the piece of crystal is heated with high thermal efficiency.

The disk heater 92 is formed, by sputtering a nickel chrome alloy onto a ceramic disk. The terminals applying voltage to the disk heater 92 are placed in the center and around the circumference of the disk heater 92, so that the thermal distribution of the disk heater 92 will be uniform. This configuration enables the heater to make the thermal resistance of the heating element highly precise and, consequently, to secure long-term stability.

In order to strengthen the thermal binding, an aluminum nitride epoxy adhesive is used for the adhesion between the disk heater 92 and the crystal unit 91 so that the heat of the heater 92 can be efficiently conducted to a piece of the crystal. As a result, excellent thermal response can be secured.

As depicted in FIG. 11, a power transistor 101, which drives the heater 92, is brought into thermal contact with the crystal oscillator 102 so that the heating by the power transistor 101 for driving the heater 92 can be utilized to heat the crystal oscillator 102. As a result, further improved thermal response can be secured.

In FIG. 11, the power transistor 101 is adhered to a metal plate 102 for thermal conduction with silver filler adhesive, fixed and thermally adhered to the crystal unit 103. Such a configuration allows a uniform conduction of heat to the crystal unit 103 through the metal plate 102 when the power transistor 101 generates heat.

Figure 12:
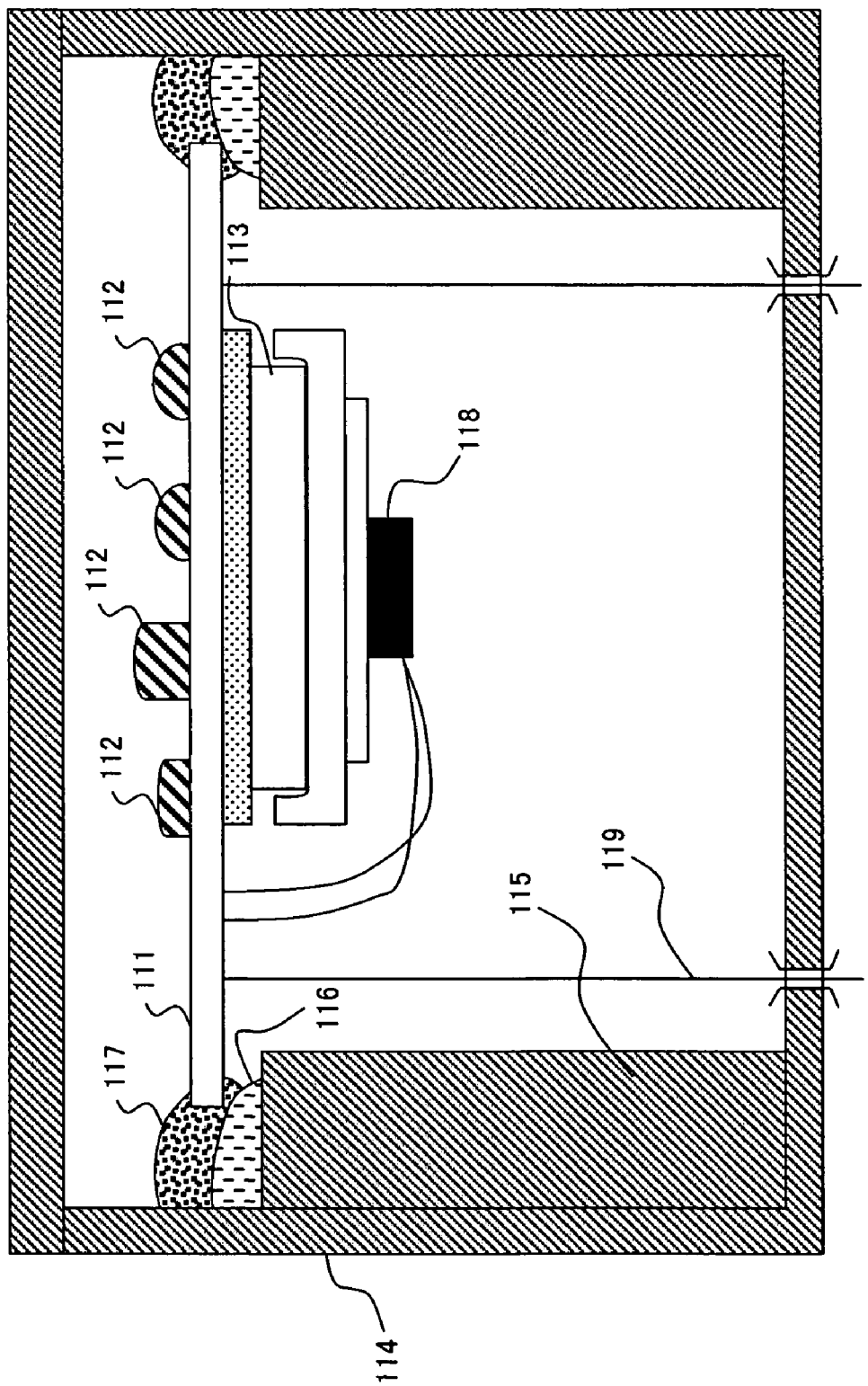
FIG. 12 is a cross-section drawing showing the inside of the crystal oscillator device package of the illustrated embodiment.

FIG. 12 is a cross-section drawing showing the inside of the crystal oscillator device package of the illustrated embodiment.

The crystal oscillator device of the illustrated embodiment has a basal plate 111, comprising each constituent element 112 of the oscillator circuit 1, a temperature switch not shown in the drawings, a crystal unit 113 and a power transistor 118, placed and vacuum-sealed in a metal package 114 so that each element on the basal plate 111 can be isolated from the external temperature. The basal plate 111 is electrically connected to the outside of the metal package 114 by hermetically sealed terminals 119.

At that time, the basal plate 111 sits in the package 114 with its four corners on bases 115, which are set inside the package 114. The areas where the base 115 contacts the basal plate 111, are covered by a layer of glass 116. The basal plate 111 rests on the glass 116 so that it does not have direct thermal contact with the base 115, and it is fixed with epoxy adhesive 117 with a poor thermal conductivity.

Because the glass 116 and the adhesive 117 are highly insulating, the thermal conduction between the basal plate 111 and the package 114 at the four points of contact can be reduced. As a result, the thermal efficiency of the heater 113 is improved, reducing power consumption.

The glass 116 and the epoxy adhesive 117 can be replaced by other materials, as long as the material is highly insulating.

What is claimed is:

1. A crystal oscillator device for simultaneously generating oscillator signals with a plurality of oscillation modes of a crystal unit, comprising: a primary resonator unit filtering the oscillator signal with a primary oscillation mode, which is one of the oscillation modes, from the output of the crystal unit;

a secondary resonator unit filtering the oscillation signal, bearing a different resonance frequency from that of the primary resonator unit, with the primary oscillation mode from the output of the crystal unit;

a primary phase synthesis unit, synthesizing the phases of the output signal of the primary resonator unit and the output signal of the secondary resonator unit;

a tertiary resonator unit filtering the oscillator signal with a secondary oscillation mode, which is one of the oscillation modes, from the output of the crystal unit;

a quaternary resonator unit filtering the oscillator signal, bearing a different resonance frequency from that of the tertiary resonator unit, with the secondary oscillation mode from the output of the crystal unit; and a secondary phase synthesis unit, synthesizing the phases of the output signal of the tertiary resonator unit and the output signal of the quaternary resonator unit, wherein the primary phase synthesis unit and the secondary phase synthesis unit are a differential amplifier.

2. The crystal oscillator device according to claim 1, wherein the primary resonator unit, the secondary resonator unit, the tertiary resonator unit and the quaternary resonator unit are crystal resonators.

3. The crystal oscillator device according to claim 1, wherein the primary resonator unit, the secondary resonator unit, the tertiary resonator unit and the quaternary resonator unit are directly connected to the crystal unit.

4. The crystal oscillator device according to claim 1, wherein the crystal unit is an SC-cut crystal unit or an IT-cut crystal unit, and the primary oscillation mode is a C-mode and the secondary oscillation mode is a B-mode.

5. The crystal oscillator device according to claim 4, further comprising a beat signal extraction unit, loosely coupling the B-mode oscillation signal to the C-mode oscillation signal and extracting a beat signal from the B-mode signal and the C-mode signal as temperature information to the crystal unit.

6. The crystal oscillator device according to claim 4, further comprising a temperature compensation control unit calculating a value representing an oscillation frequency of the beat signal from the C-mode oscillation signal and the B-mode oscillation signal with reference to the oscillation frequency of the C-mode oscillation signal, executing temperature compensation control based on the value representing the oscillation frequency of the beat signal when fluctuation of the value representing the oscillation frequency of the beat signal is small, and executing temperature compensation control based on the value representing the oscillation frequency of the beat signal and a primary specified value when fluctuation of the value representing the oscillation frequency of the beat signal is large.

7. The crystal oscillator device according to claim 6, wherein the temperature compensation unit executes temperature compensation control based on a secondary specified value when the value representing the oscillation frequency of the beat signal indicates lower than a temperature 1, and executes temperature compensation control based on a tertiary specified value when the value representing the oscillation frequency of the beat signal indicates equal or higher than a temperature 2, which is higher than the temperature 1.

8. The crystal oscillator device according to claim 6, further comprising a primary temperature detector unit detecting whether a temperature in a proximity of the crystal unit is lower than a temperature 1 or not; and a secondary temperature detector unit detecting whether the temperature in the proximity of the crystal unit is equal or higher than a temperature 2 or not, which is higher than the temperature 1, wherein the temperature compensation control unit executes temperature compensation control based on a secondary specified value when the primary temperature detector unit detects that the temperature in the proximity of the crystal unit is lower than the temperature 1, and executes the temperature compensation control based on a tertiary specified value when the secondary temperature detector unit detects that the temperature in the proximity of the crystal unit is equal or higher than the temperature 2.

9. The crystal oscillator device according to claim 1 further comprising a heater unit, which is configured to coincide with a terminal of the crystal unit, heats the crystal unit through the terminal.

10. The crystal oscillator device according to claim 9 further comprising a power transistor, which drives the heater unit, wherein the power transistor is in thermal contact with the crystal unit.

11. The crystal oscillator device according to claim 1, further comprising a package, which vacuum-seals elements configuring the crystal oscillator device.

12. A crystal oscillator device, for simultaneously generating oscillation signals with a plurality of oscillation modes of a crystal unit, comprising:

primary resonator means for filtering the oscillation signal with a primary oscillation mode, which is one of the oscillation modes, from the output of the crystal unit;

secondary resonator means for filtering the oscillation signal, bearing a different resonant frequency from that of the primary resonator means with the primary oscillation mode from the output of the crystal unit;

primary phase synthesis means for synthesizing the phases of the output signal of the primary resonator means and the output signal of the secondary resonator means;

tertiary resonator means for filtering the oscillation signal with a secondary oscillation mode, which is one of the oscillation modes, from the output of the crystal unit;

quaternary resonator means for filtering the oscillation signal, bearing a different resonant frequency from the tertiary resonator means, with the secondary oscillation mode from the output of the crystal unit; and a secondary phase synthesis means for synthesizing the phases of the output signal of the tertiary resonator means and the output signal of the quaternary resonator means, wherein the primary phase synthesis unit and the secondary phase synthesis unit are a differential amplifier.

13. A oscillation method in a crystal oscillator device, wherein oscillator signals are generated simultaneously with a plurality of oscillation modes of a crystal unit, comprising:

passing the output of the crystal unit through resonators with both sides of resonance frequency of a primary oscillation mode frequency, which is one of the oscillation modes, and generating the feedback signal and the oscillator signal of the primary oscillation mode by phase-synthesis of each output signals; and passing the output of the crystal unit through resonators with both sides of resonance frequency of a secondary oscillation mode frequency, which is one of the oscillation modes, and generating the feedback signal and the oscillator signal of the secondary oscillation mode by phase-synthesis of each output signal of the second resonators, wherein the primary phase synthesis unit and the secondary phase synthesis unit are a differential amplifier.

* * * * *